United States Patent
Chaloux et al.

(10) Patent No.: US 6,399,434 B1
(45) Date of Patent: Jun. 4, 2002

(54) DOPED STRUCTURES CONTAINING DIFFUSION BARRIERS

(75) Inventors: Susan E. Chaloux, Wappingers Falls; Johnathan E. Faltermeier, LaGrange, both of NY (US); Ulrike Gruening, Munich (DE); Rajarao Jammy, Wappingers Falls, NY (US); Christopher C. Parks, Beacon, NY (US); Paul Parries, Wappingers Falls, NY (US); Paul A. Ronsheim, Hopewell Junction, NY (US); Jean-Marc Rousseau, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/559,880

(22) Filed: Apr. 26, 2000

(51) Int. Cl.[7] .......................................... H01L 21/8242
(52) U.S. Cl. ..................................................... 438/243
(58) Field of Search ................................ 438/243, 276, 438/299, 624, 585, 676, 682

(56) References Cited

U.S. PATENT DOCUMENTS

| 4,691,219 A | 9/1987 | Goth ............................ 357/34 |
| 4,833,094 A | 5/1989 | Kenney |
| 5,051,786 A | 9/1991 | Nicollian et al. ............... 357/4 |
| 5,216,282 A | 6/1993 | Cote et al. .................... 257/773 |
| 5,363,327 A | 11/1994 | Henkles et al. ............. 365/149 |
| 5,614,431 A | 3/1997 | DeBrosse |
| 5,648,861 A | 7/1997 | Natsuhori .................... 349/116 |
| 5,792,703 A | 8/1998 | Bronner et al. ............. 438/620 |
| 5,891,798 A | * 4/1999 | Doyle et al. ................ 438/624 |
| 6,287,897 B1 | * 9/2001 | Gonsev et al. .............. 438/142 |

* cited by examiner

Primary Examiner—Howard Weiss
Assistant Examiner—(Vikki) Hoa B. Trinh
(74) Attorney, Agent, or Firm—Steven Capella

(57) ABSTRACT

Semiconductor structures having improved dopant configurations are obtained by use of barrier layers containing silicon, nitrogen, and oxygen atoms and having a thickness of about 5 to 50 Å. A doped semiconductor structure with controlled dopant configuration can be formed by:

(a) providing a first semiconductor material region,
(b) forming an interface layer comprising silicon, oxygen, and nitrogen on the first region,
(c) forming a second semiconductor material region on the interface layer, the second semiconductor material region being on an opposite side of the interface layer from the first semiconductor material region,
(d) providing a dopant in the second region, and
(e) heating the first and second regions whereby at least a portion of the dopant diffuses from the second region through the interface layer to the first region.

7 Claims, 8 Drawing Sheets

DOPED STRUCTURES CONTAINING DIFFUSION BARRIERS

CROSS REFERENCE TO RELATED APPLICATIONS

The following pending applications relate to the manufacture and use of quantum conductive barriers: U.S. Ser. No. 09/213,674, filed Dec. 17, 1998, now U.S. Pat. No. 6,194,736, U.S. Ser. No. 09/295,132, filed Apr. 20, 1999, U.S. Ser. No. 09/295,133, filed Apr. 20, 1999, now U.S. Pat. No. 6,259,129. The disclosures of these patent applications are incorporated herein by reference.

BACKGROUND OF THE INVENTION

In construction of microelectronic devices, it is well known that there is a constant pressure for reduction of device size and/or increase of device capability at a given scale.

In the actual construction of reduced scale devices, attention must be paid to higher precision in configuring the materials from which the device components are formed. A common configuration task is the positioning of dopant species within various semiconductor segments making up the ultimate device.

Control of the configuration (e.g., location and amount) of dopant species becomes especially important in the context of finer sized device components which are more sensitive to adverse dopant effects since the amount of material forming the component is smaller. For example, an interaction caused by dopant migration from one device component to another that might have only affected the border area of a large component would affect an entire component of smaller scale (e.g., where the scale of the smaller component is the same size as the border area of the larger component). Thus, reduction in component scale forces consideration of dopant configuration problems which could have been viewed as non-critical for larger scale components. Control of the dopant configuration must be considered during the device manufacture process, during device testing, and during device operation.

In the context of devices such as MOSFET transistors in semiconductor substrates, various materials are used to form the components of the transistor such as the source and drain diffusion regions, electrical contacts (studs) to the diffusion regions, various dielectric regions, gate conductor, gate oxide, etc. For example, the studs are typically metal (i.e. tungsten) or a highly doped polycrystalline silicon (polysilicon) material whereas the source and drain diffusion regions may be very shallow regions of more precise dopant level in the monocrystalline semiconductor substrate. The successful functioning of the transistor depends in part on the ability of these diverse materials to maintain their original or desirably modified character during manufacture/useful life of the device.

Unfortunately, the nature of these materials is such that unwanted dopant interactions may occur unless otherwise prevented. For example, ultra-shallow junctions (required for scalability of MOSFETs to channel lengths significantly shorter than 100 nm) present challenges to successfully forming contacts to source/drain diffusions.

In particular with ultra-shallow junctions, the contact metallurgy (the conductive stud) is prone to "spike through" to the junction edge, which results in excessive leakage currents. One technique which is commonly employed in the art avoids contact metallurgy "spike through" by forming a locally deep junction in the contact hole prior to the deposition of the conductive stud material. Additionally, in the absence of an additional deeper diffusion, crystal defects are likely to propagate from the interface between the contact metallurgy and the silicon substrate into the depletion region of the source-drain diffusion. These silicon defects also result in increased junction leakage currents. Although this deeper diffusion is spaced away from the gate conductor, its presence still degrades the short channel characteristics of the MOSFET since ultra-short channel MOSFETs are very sensitive to junction depth. Furthermore, because of alignment tolerance, the proximity of the deeper diffusion to the gate edge may vary randomly. This results in statistical variation of the electrical characteristics of the MOSFET. Therefore, the prior art technique used for contacting source-drain diffusions does not allow the MOSFET to be scaled in an optimal manner.

Additionally, the contact metallurgy may interact with the monocrystalline semiconductor substrate altering the doping of the diffusion in an undesirable manner. In the case of a tungsten stud, dopant may diffuse from the junction into the stud. This lowers the average doping concentration and increases the resistance of the diffusion. Increased diffusion resistance slows the switching speed of the MOSFET. For a polysilicon stud, which is customarily heavily doped to provide low resistance, dopant from the stud may diffuse into the semiconductor substrate. The out-diffusion from the stud may result in an excessively deep diffusion, which degrades the electrical characteristics (i.e. poorer threshold voltage control, increased off-state leakage current) of the MOSFET.

One approach to avoid unwanted interaction has been to employ a thick intrinsically conductive compound barrier (e.g. TiN or silicide) between the stud and the shallow source/drain diffusion region. See for example, the discussion in "Fundamentals of Semiconductor Processing Technologies" by B. El-Kareh, Kluwer Academic Publishers, (1995), p. 534–546. These modifications may introduce other materials interaction problems and/or add significantly to the cost/complexity of the fabrication process.

U.S. pat. application Ser. No. 09/295,132, filed Apr. 20, 1999, discloses use of quantum conductive barriers at shallow junctions to address dopant interaction problems. Nevertheless, there is a need for improved barrier materials and structures that provide improved control over dopant atoms commonly present in semiconductor electronic devices.

SUMMARY OF THE INVENTION

The invention provides novel and improved barrier layer structures and compositions which enable reduced scale device structures. The barriers of the invention advantageously enable the control of dopant diffusion profile for a given thermal history and dopant configuration.

In one aspect, the invention encompasses a semiconductor structure comprising at least two distinct semiconductor regions, each region having a common dopant species and a thin interface layer between the regions and contacting the regions, the interface layer comprising silicon, nitrogen, and oxygen atoms and having a thickness of about 5 to 50 Å. The barrier layer compositions enable control (in combination with the thermal history of the subject device) of dopant concentration and depth profile.

In another aspect, the invention encompasses a method of forming a doped semiconductor structure, the method comprising:

(a) providing a first semiconductor material region, (b) forming an interface layer comprising silicon, oxygen, and nitrogen on the first region, (c) forming a second semiconductor material region on the interface layer, the second semiconductor material region being on an opposite side of the interface layer from the first semiconductor material region, (d) providing a dopant in the second region, and (e) heating the first and second regions whereby at least a portion of the dopant diffuses from the second region through the interface layer to the first region.

These and other aspects of the invention are described in further detail below.

DETAILED DESCRIPTION OF THE INVENTION

The invention encompasses improved barrier structures and compositions, devices containing those barrier structures and methods of making which enable the formation of reduced scale devices of improved reliability.

Figure 1A:
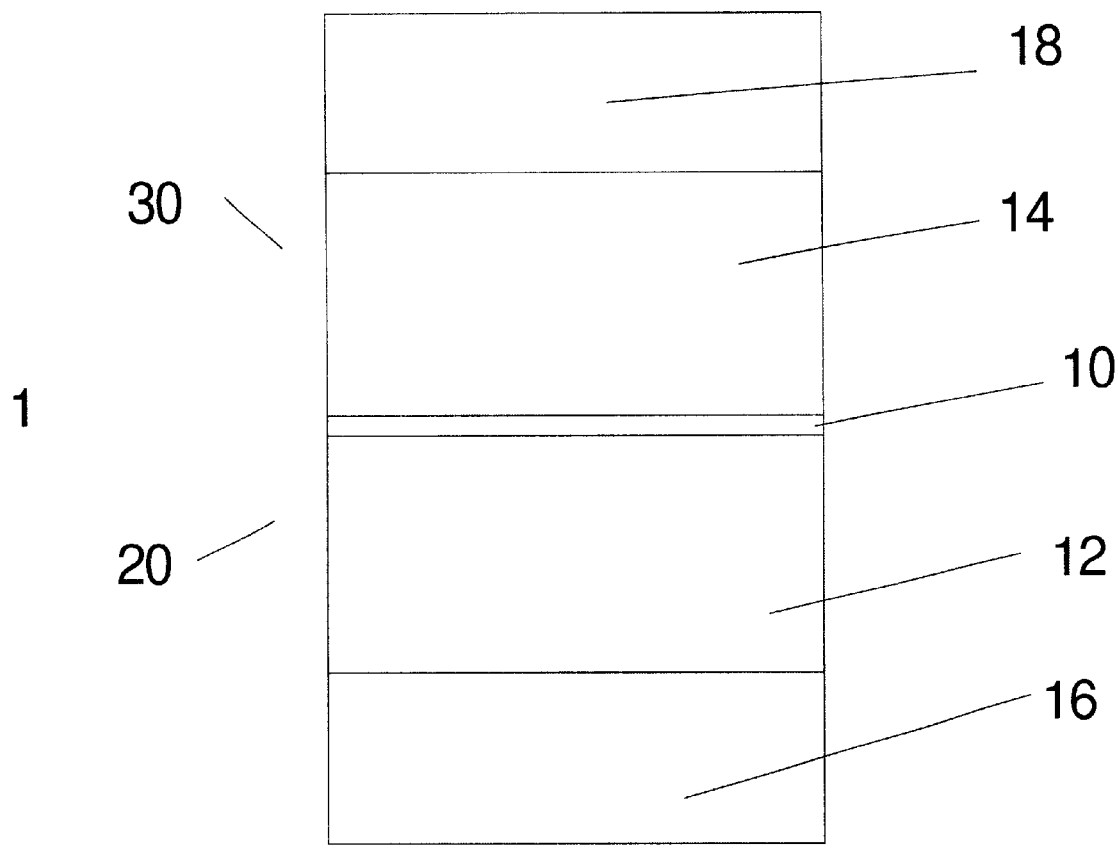
FIG. 1A is a schematic cross section of a structure having contiguous regions with a barrier structure according to an embodiment of the invention.

Referring to FIG. 1A, the barrier structures of the invention are characterized by the presence of a barrier layer 10. In FIG. 1A, the relative thickness of barrier layer 10 has been exaggerated for ease of illustration. In addition to barrier layer 10, structure 1 contains regions 12 and 16 on a first side 20 of barrier layer and regions 14 and 18 on the second side 30 of barrier layer 10. Structure 1 is such that at least one semiconductor region on first side 20 and at least one semiconductor region on second side 30 share a common dopant species.

Figure 1B:
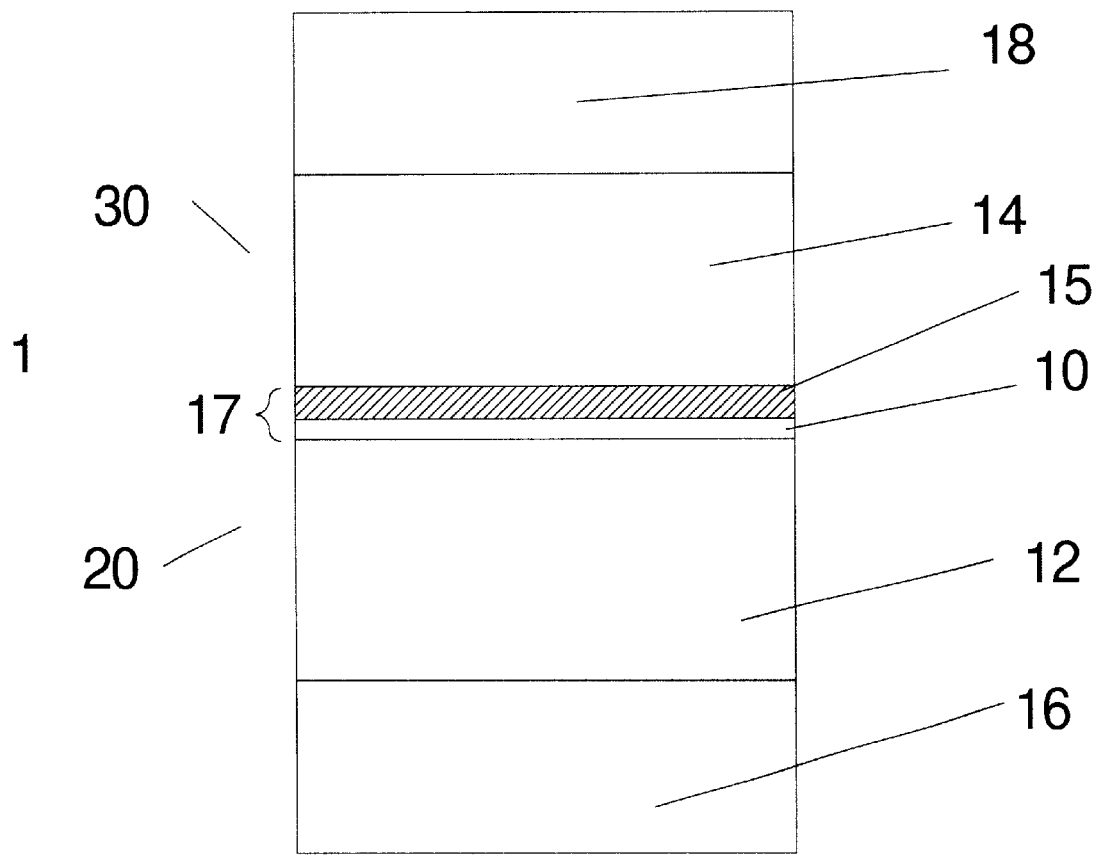
FIG. 1B is a schematic cross section of a structure having contiguous regions with an alternative barrier structure containing a companion region.

FIG. 1B shows an alternative barrier structures of the invention which is characterized by the presence of a barrier layer 10 and an amorphous, microcrystalline, or partially crystalline semiconductor material layer 15 adjacent to barrier layer 10. The two components together form a barrier structure 17. As in FIG. 1A, structure 1 contains regions 12 and 16 on a first side 20 of barrier layer and regions 14 and 18 on the second side 30 of barrier layer 10. Structure 1 is such that at least one semiconductor region on first side 20 and at least one semiconductor region on second side 30 share a common dopant species. A description of the materials and method of making layer 15 are described in copending U.S. patent application Ser. No. 09/295,133 (Docket No. FI9-99-173) filed on the same day as the present application, the disclosure of which is incorporated herein by reference.

The barrier layers of the invention preferably act to control the undesired effects of dopant species among the regions over the thermal history experienced by the structure. For example, the barrier structure may be used to control diffusion of dopant from a region (e.g., region 14) to regions 12 or 16 on the other side of barrier 10.

The barrier layers of the invention have compositions which exhibit desirable dopant diffusion barrier properties, especially where the dopant species is arsenic, boron, phosphorus, or antimony. Advantageously, the diffusion barrier properties of the barrier layers can be controlled independent of their conductive properties; in at least some instances, the barrier materials of the invention may be quantum conductive. The barrier layers preferably consist primarily of Si, O and N atoms. Preferably, the compositions have an oxygen concentration of about $1.6 \times 10^{14}$ to $3.5 \times 10^{15}$ atoms/cm$^2$, more preferably about $1.7 \times 10^{15}$ to $2.2 \times 10^{15}$ atoms/cm$^2$, and a nitrogen concentration of about $1.2 \times 10^{14}$ to $3.5 \times 10^{15}$ atoms/cm$^2$, more preferably about $2.0 \times 10^{15}$ to $3.5 \times 10^{15}$ atoms/cm$^2$, the concentrations being measured by SIMS. The balance of the barrier compositions is preferably silicon. The barrier compositions preferably have a carbon concentration of less than about $1 \times 10^{14}$ atoms/cm$^2$. The presence of significant amounts carbon generally acts to inhibit electrical conduction to a great extent. The carbon content can be limited by creating/maintaining a clean substrate/processing environment. If there is a circumstance where increased carbon content is desired, such content can be obtained by implantation or other suitable technique.

The barrier layers preferably have a thickness of about 50 Å or less, more preferably about 5–30 Å, most preferably about 5–15 Å. The resulting films preferably have a film resistance of less than about 1 K-ohm-$\mu$m$^2$, more preferably less than about 100 ohm-$\mu$m$^2$. The series resistance introduced by the barrier layer is equal to the film resistivity (ohm-$\mu$m$^2$) divided by the cross sectional area ($\mu$m$^2$) of the barrier layer normal to the direction of current. The bulk resistivity (measured in a thick section at 25° C.) of the materials used to make up the barrier layers of the invention is preferably at least about $10^6$ ohm-m, more preferably at least about $10^8$ ohm-m, most preferably at least about $10^{11}$ ohm-m.

The barrier layers of the invention are preferably substantially uniform, however some variation in thickness may be permissible. Preferably, the layer thickness is kept in a range permitting the desired barrier function for all points on the layer. The regions of the structure bordering or contiguous with the barrier layer, preferably include, at least one region on each side of the barrier being a doped semiconductor having a common dopant species between the regions. More preferably, at least on region directly contacting the barrier layer is a monocrystalline semiconductor material, most preferably silicon.

The barrier structures of the invention are especially useful in trench capacitor structures and at contacts to shallow junctions (i.e., where avoidance of punch-through is desired). Examples of typical trench capacitor structures are shown in U.S. Pat. Nos. 5,283,453; 5,395,786; 5,434,109; 5,489,544; 5,512,767; 5,576,566; 5,656,535; and 5,677,219, the disclosures of which are incorporated herein by reference. The trench capacitor structures of the invention are not limited to any specific configuration. Examples of shallow junctions are disclosed in U.S. patent application Ser. No. 09/295,132 referred to above.

The position of the barrier structures of the invention is described below in connection with a conventional buried strap trench capacitor, however, the invention is not limited to any specific strap configuration. Thus, the invention is similarly useful in conjunction with trench capacitors having notch straps, divot straps, lip straps or surface straps.

Figure 2:
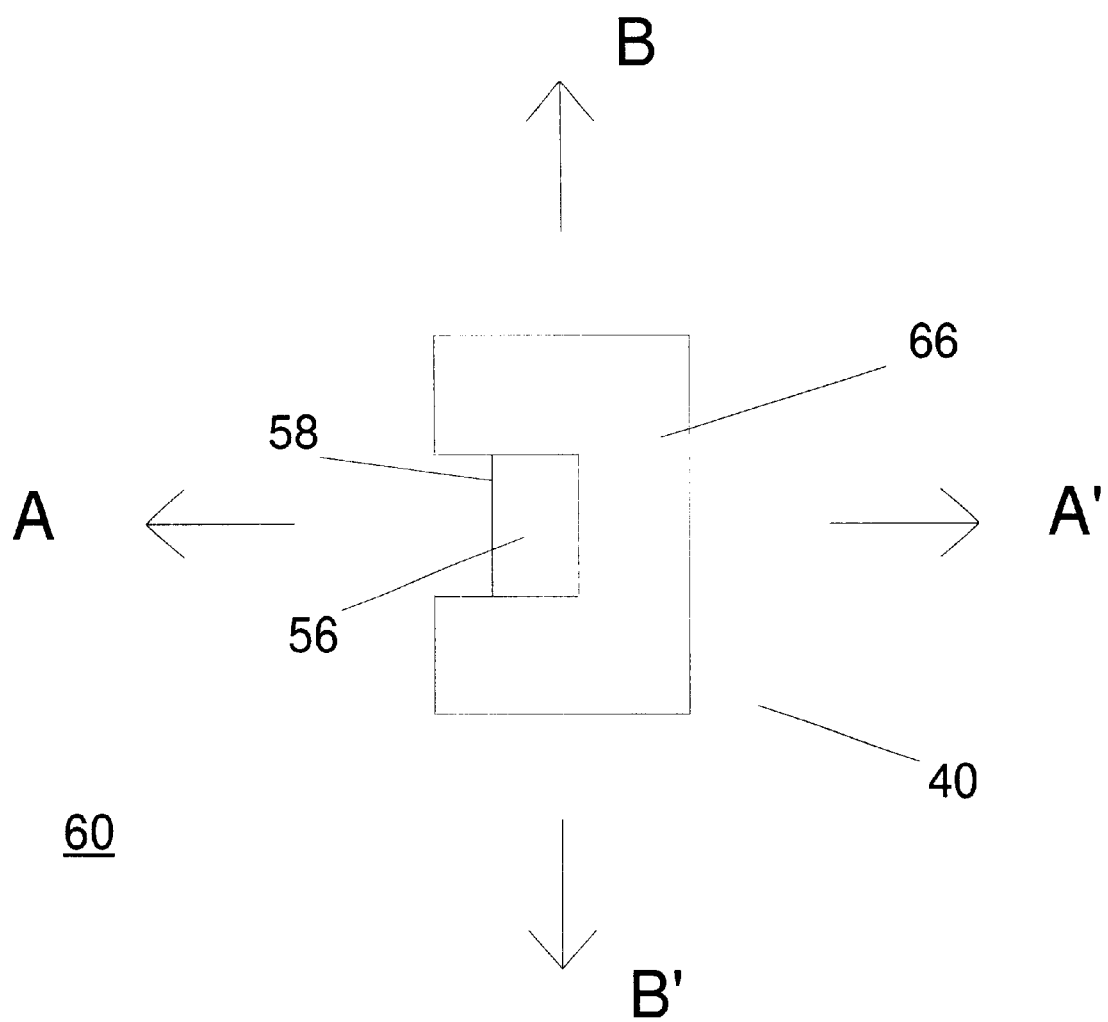
FIG. 2 is a schematic plan view of a deep trench capacitor taken from trench top level with the buried strap exposed.

FIG. 2 shows a schematic plan view of a typical trench capacitor structure 40 taken at the top of the trench in substrate 60 with the buried strap 56 exposed to reveal interface 58 between substrate 60 and strap 56. Shallow trench isolation (STI) 66 surrounds the top area of capacitor 40 on three sides.

Figure 3A:
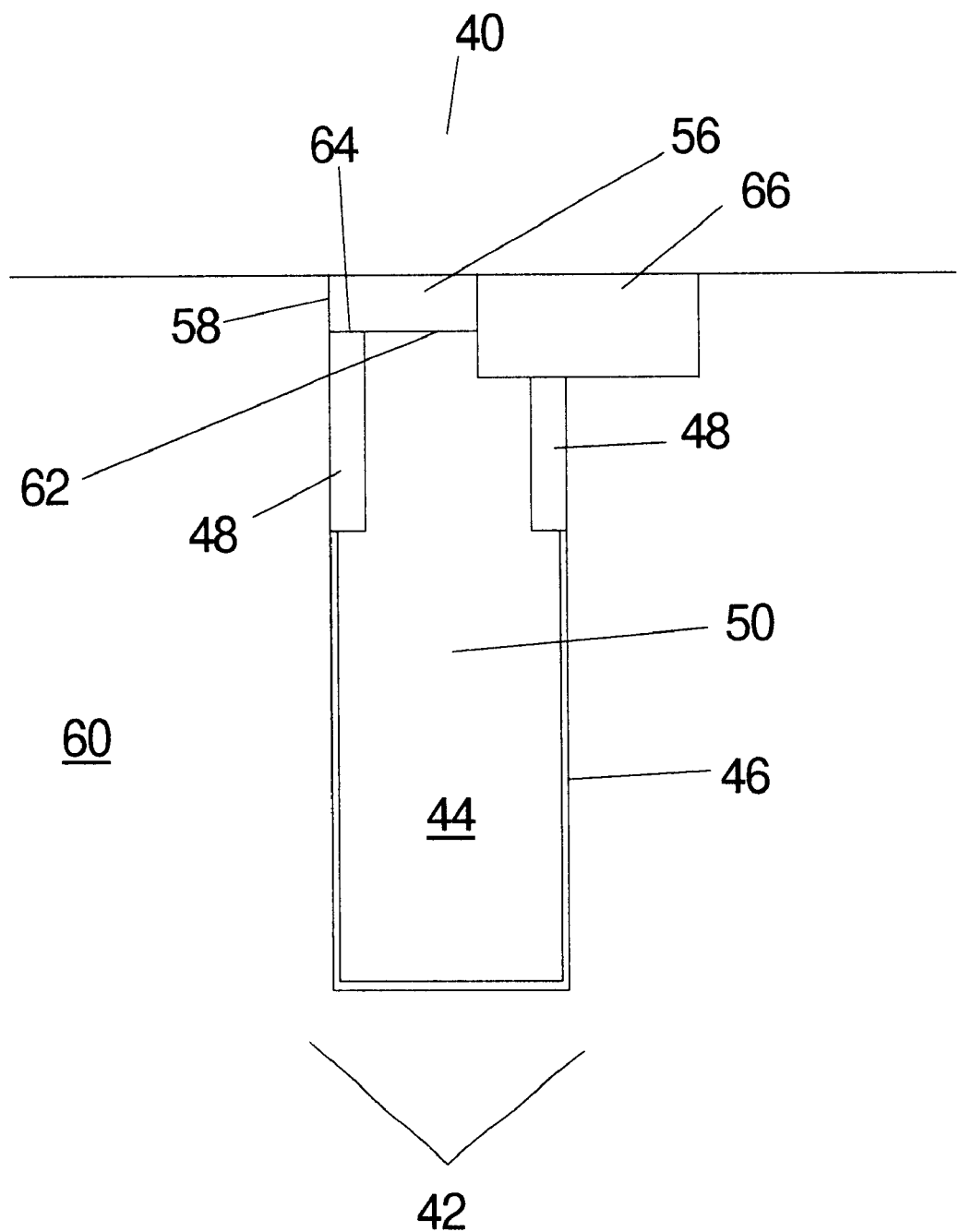
FIG. 3A is a schematic cross section of the deep trench capacitor structure of FIG. 2 at line A–A'.

FIG. 3A shows a schematic side view of the trench capacitor of FIG. 2. A buried plate electrode 42 is located about the exterior of a lower portion of the trench 44. A node dielectric 46 is present about the lower portion of the interior of trench 44. About the upper interior of trench 44 is an oxide collar 48. Trench 44 is filled with a conductive trench electrode material 50. A conductive strap 56 resides over and is electrically connected to trench electrode 50. Strap 56 thus provides electrical access to capacitor 40.

Figure 3B:
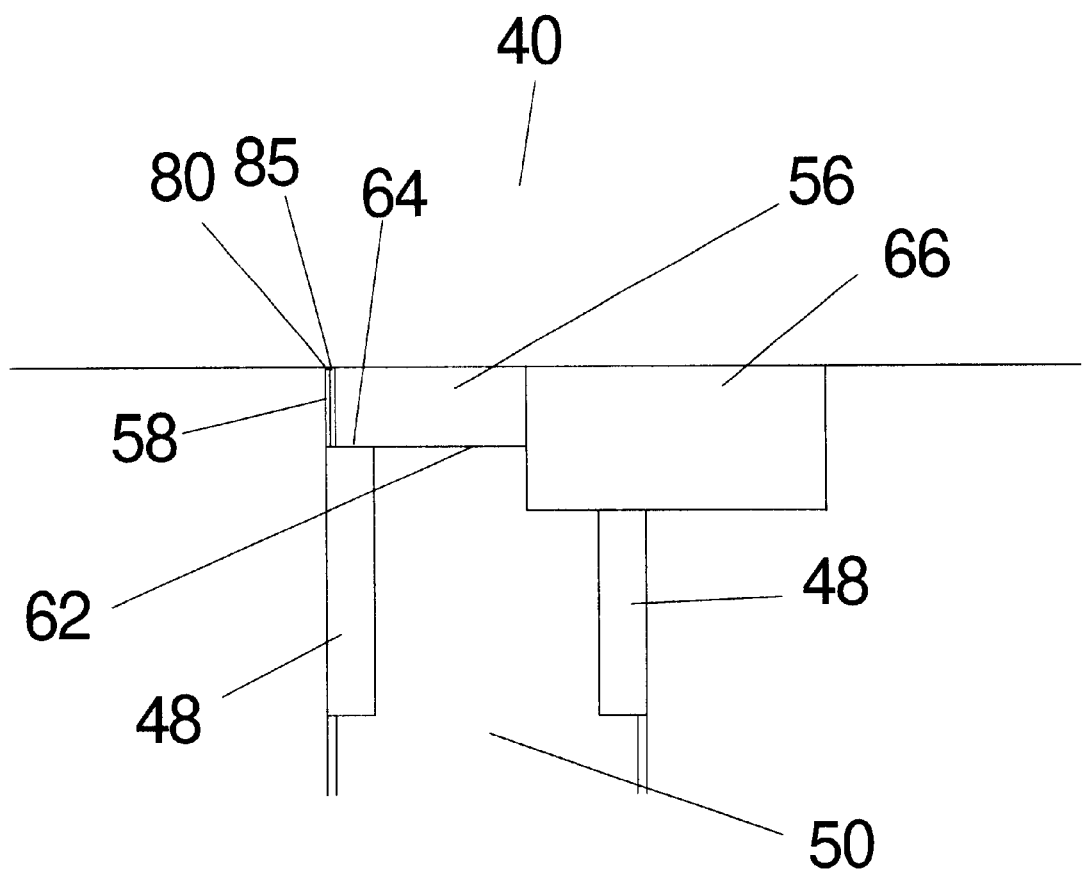
FIG. 3B is a portion of FIG. 3A in the strap region showing a barrier structure.
Figure 4:
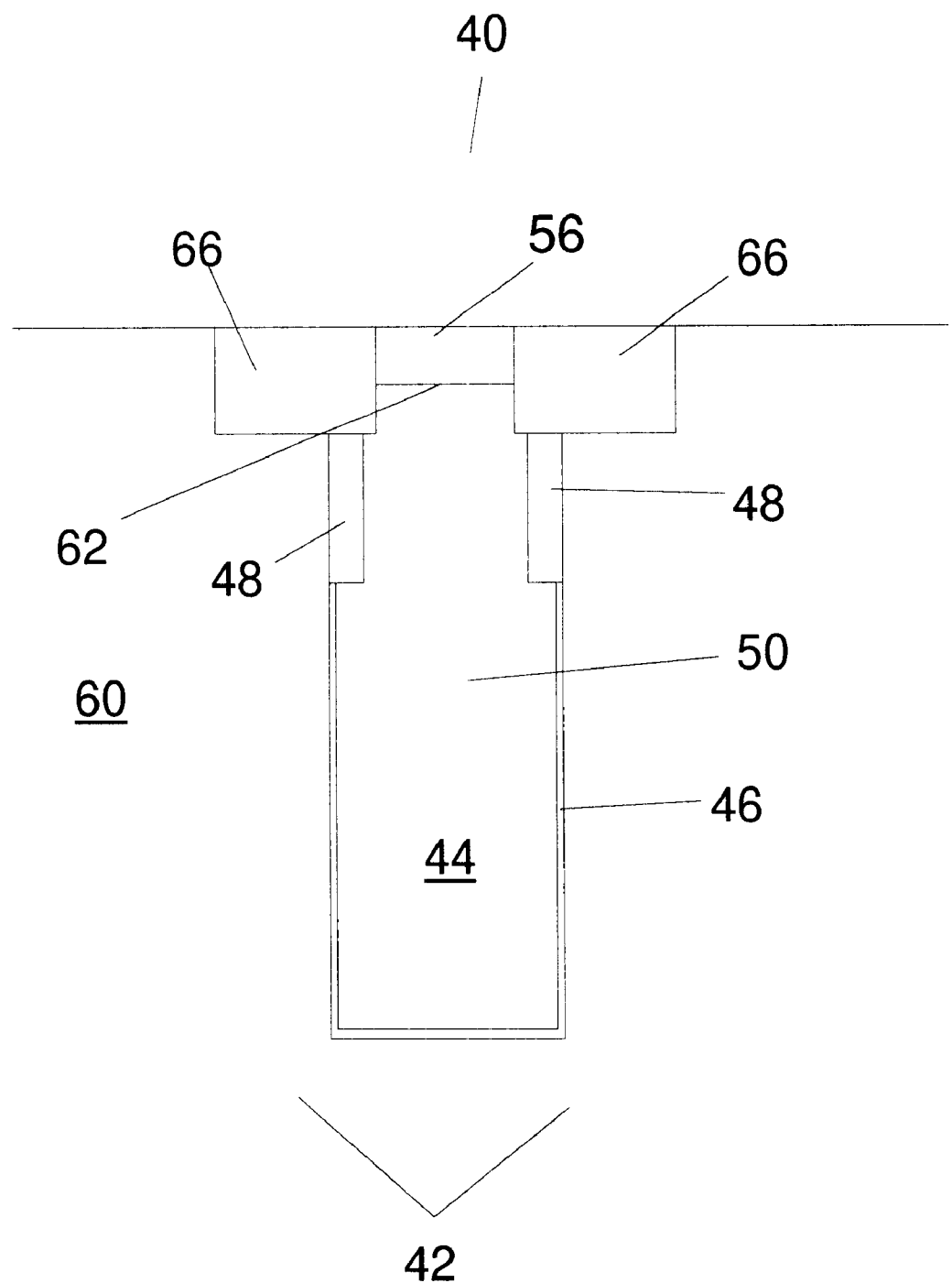
FIG. 4 is a schematic cross section of the deep trench capacitor structure of FIG. 2 at line B–B'.

The barrier structures of the invention may be located at one or more locations within a trench capacitor structure as desired to control dopant diffusion from one side of the barrier layer to the other, especially if one of the above mentioned Si—O—N compositions is employed. For example (FIG. 3B), a barrier structure (e.g., including a barrier layer 80 and a companion layer 85) may be located at interface 58 between conductive strap 56 and substrate 60. If desired, a barrier structure may also be located at interface 62 between trench electrode 50 and strap 56.

The invention encompasses trench capacitor structures where barrier structures are located at one or more of the interfaces described above and/or at other locations within the capacitor structure as desired. Where the barrier layer is formed by chemical vapor deposition, physical vapor deposition or sputtering, the layer may also optionally be present at the interface 64 between collar oxide 48 and strap 56.

The invention is not limited to any specific material compositions for the various components of the trench capacitor (or other device). If desired, materials described in the art may be used. Thus, the trench electrode 50 would typically be made of a doped polycrystalline silicon or other suitably conductive material. Strap 56 would typically be made of amorphous silicon. Substrate 60 would typically be a monocrystalline semiconductor material (most typically silicon, lightly doped silicon or silicon having lightly doped bands). The buried plate 42 is typically a high dopant (e.g., arsenic) region within the substrate. The collar 48 and shallow trench isolation 66 are typically a silicon dioxide.

Figure 5:
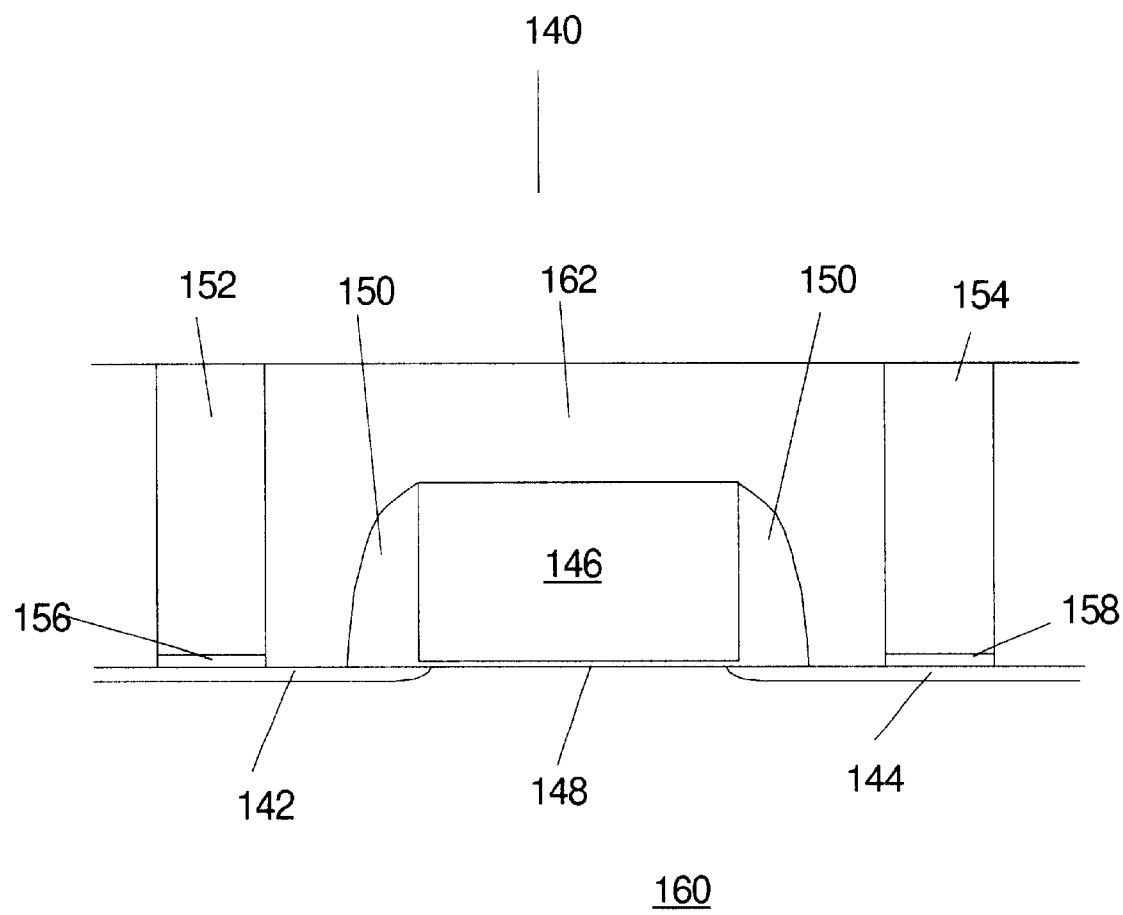
FIG. 5 is a schematic cross section of a MOSFET transistor showing the barrier layer of the invention.

FIG. 5 illustrates another embodiment of the invention. FIG. 5 shows a schematic side view of a MOSFET 140 in a substrate 160. Shallow source/drain diffusions (doped regions) 142 and 144 are formed in substrate 160. A gate conductor 146 is formed over a gate oxide 148 between the source/drain diffusions. Side wall spacer 150 is preferably located along the sides of gate conductor 146. Conductive studs 152 and 154 contact diffusions 142 and 144 through barrier layers 156 and 158 respectively. Conductive studs 152 and 154 are separated from the gate conductor stack by insulating layer 162. The barrier layer of the invention, located at the interface between the conductive studs and the shallow diffusions advantageously acts to prevent or inhibit diffusion of dopants from the studs to the diffusions (or vice versa) and further into substrate 160. Thus, the barrier layer minimizes any deepening of the shallow diffusions caused by unwanted dopant migration from the conductive studs.

The invention is not limited to any specific MOSFET or other transistor device configuration incorporating the structures of the invention. Examples of various transistor structures are disclosed in U.S. Pat. Nos. 4,691,219; 4,833,094; 5,216,282; 5,363,327; 5,614,431; and 5,792,703, the disclosures of which are incorporated herein by reference. It should be understood that the layers may be used in other integrated circuit components where very thin barrier layers are desired to control dopant diffusion.

For MOSFET or other transistor devices, the invention is not limited to any specific material compositions for the various components of the shallow diffusions, the conductive studs or other components. If desired, materials described in the art for forming MOSFETs or other devices employing shallow diffusions may be used. Thus, the studs 152 and 154 would typically be made of tungsten or a doped polycrystalline silicon. Substrate 160 would typically be a monocrystalline semiconductor material (most typically silicon, lightly doped silicon or silicon having lightly doped bands). The shallow diffusions would typically be formed by diffusing an appropriate N-type or P-type dopant into the substrate. The insulating layer(s) is typically a silicon dioxide. If present, the gate conductor may be a doped polysilicon or other conductive gate stack composition. The sidewall may be a silicon oxide, silicon nitride, or other appropriate insulating material.

The composition and physical characteristics of the barrier layers used in the devices of the invention are preferably those described above. Advantageously, the barrier structures of the invention can perform the desired barrier function without adversely affecting the electrical performance of the device.

The use of alternative or modified materials may be enabled by the presence of the barrier structures of the invention. For example, electrode materials having very high dopant levels may be used (e.g., $5 \times 10^{18}$–$10^{21}$, more preferably $5 \times 10^{19}$–$10^{20}$ dopant atoms per $cm^3$). In some instances, alternative electrode materials (e.g., silicides, conductive metal nitrides, etc.) may be used in place of conventional doped polysilicon.

The barrier structures of the invention may be made by various methods. The choice of method may depend on the composition of the surface on which the barrier layer is to be formed and/or the desired barrier layer composition.

Where the surface on which the layer is to be formed has a high silicon content (e.g., a conventional (doped or undoped) polycrystalline, amorphous or monocrystalline silicon), the barrier layer is preferably formed by reacting a portion of the silicon at the immediate surface with a nitrogen-containing compound in the atmosphere contacting the surface. Preferred nitrogen-containing compounds are those which are easily handled in a gaseous state. Examples of preferred nitrogen compounds are selected from the group consisting of ammonia, $NO_1$ $N_2O$ or (under plasma conditions) monatomic nitrogen. Ammonia is the most preferred nitrogen compound. The atmosphere may also contain one or more diluent gases such as $N_2$, helium or argon. The partial pressure of the nitrogen compound is preferably about 1–760 Torr, more preferably about 5–10 Torr. The reaction is typically facilitated by heating to a temperature of about 300–950° C., more preferably about 350–750° C. The reaction may be conducted until the desired layer thickness is formed. Preferably, the reaction is conducted for about 1–30 minutes, more preferably about 10–20 minutes. The reaction is typically self-limiting under these conditions. Alternatively, a high temperature (e.g., 950° C.) nitridation may be used in some circumstances.

If desired, the substrate may be precleaned by a chemical etch (e.g. HF solution) and/or by a high temperature (e.g., about 900°–1000° C.) bake in a hydrogen atmosphere (or other appropriate reducing atmosphere) to remove some or all of any pre-existing oxide surface layer. The techniques described in U.S. Pat. No. 5,194,397 may also be used to control the presence of oxide film. Other known methods for removal of residual films may also be used where appropriate.

Where an increased oxygen content is desired, the above nitrogen reaction process may be conducted with a substrate having a pre-existing very thin oxide layer. In such instances, the relative contents of oxygen and nitrogen in the barrier layer can be controlled by the temperature and time of the nitrogen compound reaction, with higher temperatures and longer reaction times giving a more nitrogen-rich layer. Alternatively, if desired, oxygen enriched layers may be formed by introducing a very minor amount of oxygen into the nitrogen compound-containing atmosphere. In general, this method is generally less preferred since control of the oxygen content and/or layer thickness may be difficult. To produce the preferred Si—O—N compositions of the invention, the above conditions can be used with nitriding temperatures in the range of about 650–800° C. Alternatively, plasma techniques, such as remote plasma can be used to generate desired barrier layer structures.

Where reaction of the underlying surface is not desired or not practical, the barrier layer may be formed by chemical vapor deposition, physical vapor deposition or sputtering. In such instances, the reactants for forming the barrier layer may be those typically used to form thin film layers of the corresponding dielectric material, however the reaction conditions (time, temperature, pressure) and/or proportions of the reactants must be appropriately reduced to avoid deposition of an excessively thick film. See for example the process for forming germanium oxide thin films described in U.S. Pat. Nos. 5,648,861 and 5,051,786, the disclosures of which are incorporated herein by reference. Alternative methods for forming the desired thin films may be found in the "Handbook of Thin Film Technology" by Maissel & Glang, McGraw-Hill Book Co. (1970) and in similar treatises.

In general. the invention encompasses methods of forming a doped semiconductor structure comprising:
  (a) providing a first semiconductor material region,
  (b) forming an interface layer comprising silicon, oxygen, and nitrogen on the first region,
  (c) forming a second semiconductor material region on the interface layer, the second semiconductor material region being on an opposite side of the interface layer from the first semiconductor material region,
  (d) providing a dopant in the second region, and
  (e) heating the first and second regions whereby at least a portion of the dopant diffuses from the second region through the interface layer to the first region.

The interface layer is preferably formed using one of the techniques described above. The heating step may be performed as part of an overall process for manufacturing the desired semiconductor device.

For example, trench capacitor structures containing the barrier structures of the invention may be formed by inserting one of the above barrier structure formation techniques at an appropriate point(s) in the overall process of capacitor manufacturing process. The overall trench capacitor manufacturing process used may be any of those known in the art such as those described in the patents mentioned above. Alternatively, other variations on trench capacitor manufacturing processes may also be used (e.g., processes involving formation of collar oxides by the LOCOS technique).

Alternatively, a deep trench capacitor with a barrier layer of the invention at the interface of the strap and the trench electrode may be formed by:
  (a) providing a monocrystalline semiconductor substrate having (i) a buried plate in an exterior portion of trench in the substrate, (ii) a node dielectric about at least a lower interior portion of the trench, and (iii) an electrode in the trench,
  (b) removing an upper portion of the electrode to provide space for a conductive strap, thereby exposing electrode and substrate surface,
  (c) directionally depositing a thin Si—O—N material layer on the electrode surface,
  (d) optionally depositing a companion layer over the thin dielectric material layer,
  (e) isotropically etching the thin Si—O—N material layer and any companion layer to remove any Si—O—N material and companion layer deposited on the exposed substrate surface, thereby leaving a barrier structure on the electrode surface only, and
  (f) filling the space formed in step (b) with a conductive strap material.

Preferably, a collar oxide is provided about the upper interior portion of the trench in step (a). Shallow trench isolation would typically be formed after filling step (f) by etching to define a space for the isolation and filling that space with the desired shallow trench isolation material.

The process could be modified where other strap formation techniques or configurations are employed. Where a trench capacitor (or other device) formation process does not naturally provide the surface where a barrier is desired, such a process can be modified by adding appropriate etch back, layer formation and fill steps, the etch and fill steps being selected from those known in the art for the specific materials involved.

Figure 6:
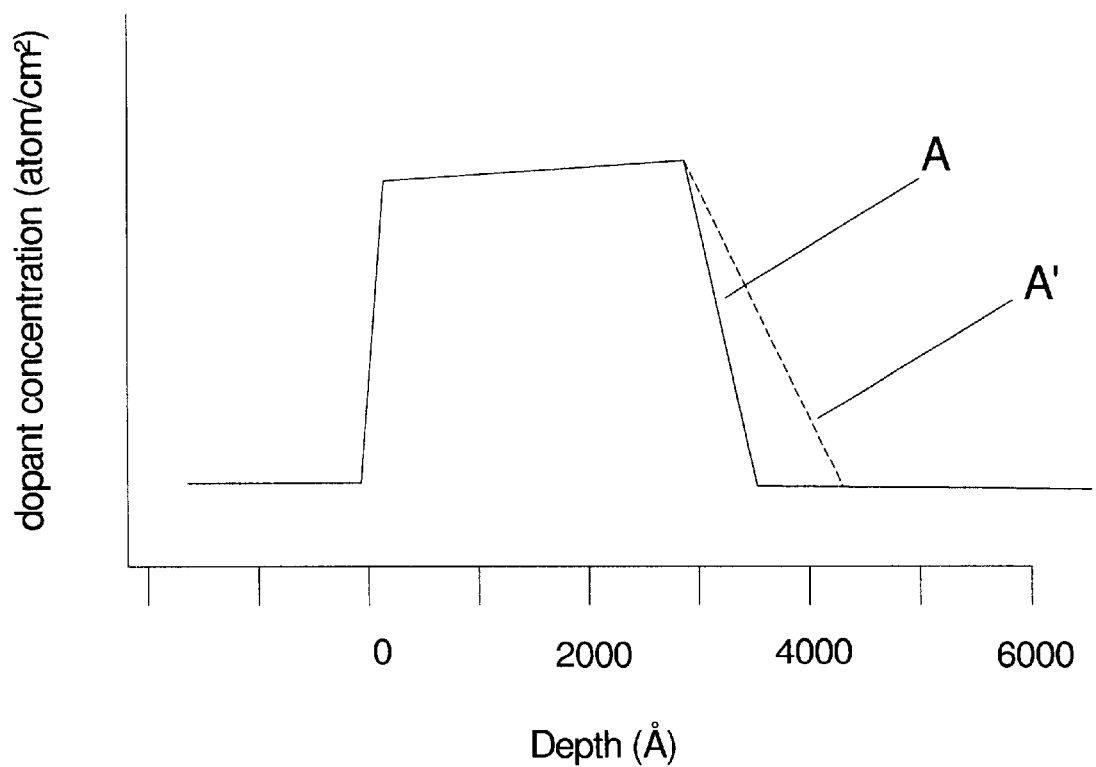
FIG. 6 is a schematic plot of dopant concentration as a function of depth across an interface barrier layer of the invention.

The methods of forming doped structures of the invention advantageously enable improved control over dopant profiles in regions on an opposite side of the barrier layer (i.e., opposite a highly doped region on the other side. In FIG. 6, a profile is shown for a typical dopant such as arsenic for the thermal history typically experienced in the formation of a trench capacitor device. Zero represents the interface location. Slope A shows the dopant concentration for the given thermal history and composition of the barrier layer. If the nitrogen content of the barrier layer is decreased or the thermal treatment is increased (in time and/or temperature), the slope A can be shifted to a slope such as A'. A similar behavior is observed with other dopants such as boron except the depth and concentrations may be different. Thus, a similar change in nitrogen content or thermal treatment might cause a shift on the order of 100 Å in the backside dopant concentration slope.

What is claimed is:

1. A method of forming a doped semiconductor structure, said method comprising:
  (a) providing a first semiconductor material region,
  (b) forming an interface layer comprising silicon, oxygen, and nitrogen on said first region,
  (c) forming a second semiconductor material region on said interface layer, said second semiconductor material region being on an opposite side of said interface layer from said first semiconductor material region, (d) providing a dopant in said second region, and (e) heating said first and second regions whereby at least a portion of said dopant diffuses from said second region through said interface layer to said first region.

2. The method of claim 1 wherein said first semiconductor region comprises silicon and step (b) comprises reacting a surface portion of said first region with a nitrogen compound selected from the group consisting of ammonia, NO, $N_2O$, and monatomic nitrogen.

3. The method of claim 1 wherein step (b) is performed at about 300–950° C.

4. The method of claim 2 wherein said reacting of step (b) is conducted in an atmosphere containing a minor amount of oxygen.

5. The method of claim 4 wherein said atmosphere contains a gas selected from the group consisting of $N_2$, argon, helium, and mixtures thereof.

6. The method of claim 1 wherein said interface layer has a thickness of about 5 to 50 Å.

7. The method of claim 6 wherein said nitride layer has a thickness of about 5–10 Å.

* * * * *